Nov. 17, 1970 J. A. RACITI 3,541,225
ELECTRICAL CONDUCTOR WITH IMPROVED SOLDER CHARACTERISTICS
Original Filed Aug. 29, 1966 2 Sheets-Sheet 1

INVENTOR
JOSEPH A. RACITI
BY George A. Herbster
ATTORNEY

ELECTRICAL CONDUCTOR WITH IMPROVED SOLDER CHARACTERISTICS

Original Filed Aug. 29, 1966 2 Sheets-Sheet 2

INVENTOR
JOSEPH A. RACITI
BY George A. Webster
ATTORNEY

United States Patent Office 3,541,225

Patented Nov. 17, 1970

3,541,225

ELECTRICAL CONDUCTOR WITH IMPROVED SOLDER CHARACTERISTICS

Joseph A. Raciti, East Boxford, Mass., assignor to General Electric Company, a corporation of New York

Original application Aug. 29, 1966, Ser. No. 575,813. Divided and this application Dec. 20, 1968, Ser. No. 785,649

Int. Cl. H01c *1/14;* H02g *15/02;* H05k *3/30*

U.S. Cl. 174—74 2 Claims

ABSTRACT OF THE DISCLOSURE

An electrical conductor having improved soldering characteristics. The conductor has a plurality of independent solder capillaries formed therein. Each capillary consists of a longitudinal groove in the conductor.

BACKGROUND OF THE INVENTION

This application is a division of a co-pending application filed Aug. 29, 1966, Ser. No. 575,813, assigned to the same assignee as the present invention.

This invention is directed to improved electrical conductors and, more specifically, to an electrical conductor construction which provides improved solder connections.

Printed circuit board assemblies are now widely accepted in the electronics industry and are used both as single boards having a plurality of electrical components mounted thereto and in combination with other printed circuit board assemblies to form printed circuit modules. In the production of such printed circuit board assemblies, components, such as resistors, capacitors or solid state devices, are usually mechanically located on the printed circuit board and then are subjected to a soldering operation performed manually or automatically either by wave or dip soldering processes. The molten solder usually is applied to the circuit side of the printed circuit board to solder metallized surfaces formed thereon to electrical component leads. However, the reliability of such solder connections is often inadequate when conventional smooth electrical leads are used. The solder connections tend to "dewet" (i.e. solder does not stick to the conductor as a result of contamination or insufficient fluxing) and thereby cause electrical discontinuities with resultant faulty circuit operation. Furthermore, soldering is sometimes required on both sides of a printed circuit board when a two-sided board is used. Two-sided boards normally include plated through-holes; but when conventional leads are used in conjunction with wave or dip soldering, reliable interface connections between the electrical lead and the plated through-holes have not been obtained. Therefore, some hand soldering is normally required with this type of printed circuit board.

As a result of the potential savings in manufacturing costs which are made possible by the use of printed circuit boards and mass soldering, there have been several attempts made to improve the solder reliability of such an electrical connection to thereby increase the reliability of the printed circuit board. An initial attempt was made by forming an eyelet through the hole in the printed circuit board, the eyelet being rounded to engage the circuit pad or conductive surfaces on the printed circuit board. However, air would become trapped between the eyelet in the circuit pad during the soldering process; and this would cause solder trapped between the circuit pad and the eyelet to degas during the soldering process. This would result in a solder connection of questionable reliability. This attempt in improving solderability of printed circuit boards was followed by the use of the device commonly known as a funnel eyelet wherein the cross-sectional view of the eyelet appeared as a funnel; but the eyelet was not bent back onto the circuit pad. It was found that normally any capillary action produced between the eyelet and the lead was insufficient to fill both funnels of the eyelet with solder. Reliable connections were made only when the solder in the top funnel spilled over onto the top circuit pad. Although this method proved to be better than the initial eyelet solution discussed above because it eliminated the problem of degasing during the soldering operation, there was still a requirement for hand solder in order to spill solder over the top of the funnel to the circuit pad.

Eyelets were later replaced by the use of plated through-holes wherein the circuit pads on both sides of the insulating board were interconnected by a plating which extended through the hole. If the diameter of the aperture through the insulating board could be maintained constant throughout, then this solution would have found more acceptance. However, it was found that during the printing procedure the hole diameter did not remain constant, but it increased to a maximum at the center of the aperture. As a result of this increased diameter, there was an enlarged space midway through the hole, and the capillary action would tend to stop at this point as is well known in the art because the cooling effect would result, causing the solder to stop its upward flow.

In order to obviate this problem, it was subsequently suggested that a thin-walled copper clip should be staked to the component lead and then inserted through a plated through-hole. Although this type of device improved the capillary action, it required the addition of a separate element which tended to become prohibitive from a cost standpoint. In addition, the use of such a device did not lend itself to high density packaging of electrical components as is presently being encountered in the electronic industry.

These attempts may be described as through-hole alteration by the use of eyelets, inserts or plating which are specially formed to induce capillary action when molten solder is applied to thereby draw solder through the eyelet and enhance the circuit connection. Beyond these problems mentioned above, insertion of eyelets adds elements normally having a distinct coefficient of thermal expansion and this solution has been found to lead to inadequate solder connection strength.

In another scheme, component leads or electrical conductors, hereinafter referred to generically as wires, have been flattened and tapered to induce capillary action when inserted through an aperture. It has been found that the relative dimensions of the wire and of the aperture are critical if capillary action is to be induced. Hence, if a plurality of aperture sizes are involved, each wire must be dimensioned especially for that aperture. Such custom formation can be expensive especially when several aperture sizes are involved so standardization cannot be accomplished. Therefore, while these solutions, as evidenced by the cited examples, have provided some improvements, they have been overbalanced either by the additional costs involved or by resultant adverse side effects.

Even though some of these methods described above may have been adequate in the prior art, the anticipated use of multi-layer printed circuit boards and integrated circuits has resulted in a requirement for providing a positive means of causing the solder to flow through the entire package on one soldering operation. As will be obvious to those skilled in the art, adequacy of the prior art methods does become questionable with the presently anticipated use of multi-layer circuit boards in conjunction with integrated circuits or other presently anticipated electronic packing schemes.

Therefore, it is an object of this invention to provide an electrical conductor which effects improved solder connections.

Still another object of this invention is to provide an electrical conductor for effecting improved solder connections without requiring additional elements.

Another object of this invention is to provide an electrical conductor for effecting improved solder connections especially adapted for printed circuit board construction.

SUMMARY

In accordance with one aspect of this invention, an electrical conductor has a plurality of longitudinal grooves formed in the surface thereto. Each longitudinal groove defines an independently acting solder capillary. Therefore, the application of solder to one end of the conductor will result with a solder transfer along a substantial length of the conductor due to the capillary action.

This invention has been pointed out with particularity in the appended claims. However, the above and further objects and advantages of this invention can be more fully realized by reference to the following detailed description of typical electrical connections formed in accordance with this invention.

DESCRIPTION OF ILLUSTRATIVE EMBODIMENTS

Figure 1:
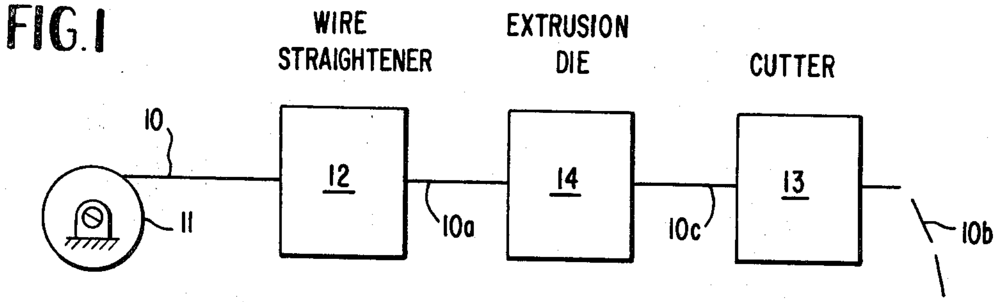
FIG. 1 illustrates a process by which the improved conductors can be produced.

FIG. 1 illustrates how a process which is used by manufacturers of electrical components can be modified to incorporate this invention. Normally a wire 10 is removed from a supply spool 11 and passed through a wire straightening means 12 to remove any wire curl. Generally the straightened wire, designated 10*a*, is passed through a cutter means 13 which severs the straightened wire 10*a* into a plurality of cut wires, designated 10*b*, of an appropriate length to be affixed to an electrical component such as a resistor, capacitor, or solid state devices or to an integrated circuit, micromodule, or other electronic package.

Electrical wires formed in accordance with this invention are fabricated by disposing an extrusion die 14 between the wire straightener 12 and the cutter 13. As the wire moves through the extrusion die 14, a plurality of longitudinally extending grooves are formed about the periphery of the wire 10*a* so a grooved wire 10*c* enters the cutter 13.

Figure 2:
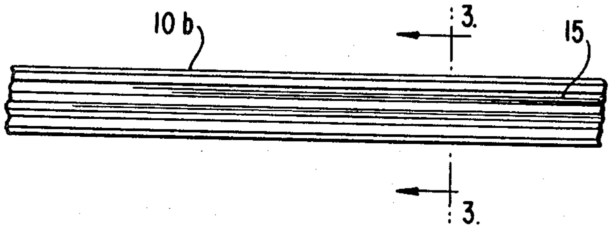
FIG. 2 presents an enlarged view of a conductor formed in accordance with this invention.
Figure 3:
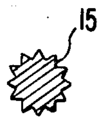
FIG. 3 is a sectional view taken along lines 3—3 in FIG. 2.

A portion of such a wire 10*b* formed in accordance with this invention is shown in FIGS. 2 and 3 in enlarged views so that the plurality of grooves 15 can be seen more easily. Although the shape of the groove in cross-section seems to be relatively unimportant, groove depths from 1 mil through 5 mils seem to optimize capillary action. Therefore, the exact groove configuration is not important. Although each groove induces capillary action independently so that any number of grooves can be formed in the wire, it will be generally desirable to form as many grooves as possible. The number of grooves formed will be dependent upon the cross-sectional shape and depth of the groove and the wire diameter.

By forming these longitudinally extending grooves about the periphery of a wire, it has been found that two related advantages are obtained because the grooves expand the solder area obtained for a wire of a given diameter. First, capillary action is induced by the grooves. It has been found that if one end of a wire formed in accordance with this invention is placed in contact with molten solder, the solder is drawn up the grooves for a considerable distance. Secondly, so the solder joint is strengthened mechanically and electrically.

Figure 4:
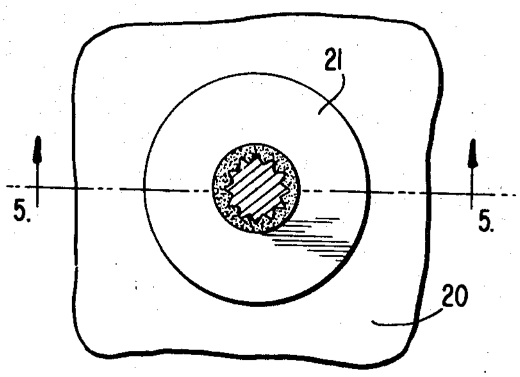
FIG. 4 illustrates a printed circuit board including a soldered connection using a wire formed in accordance with this invention.
Figure 5:
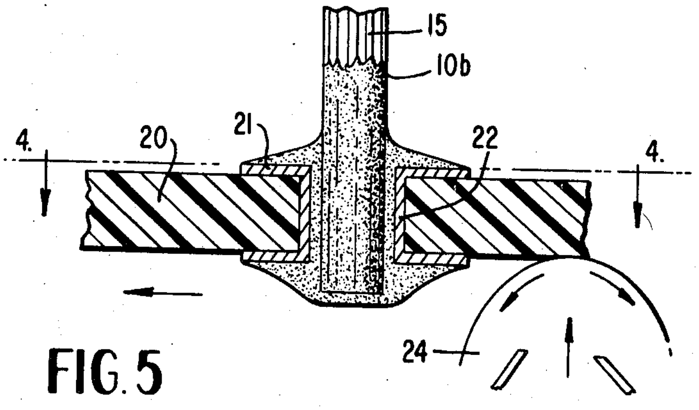
FIG. 5 is a sectional view taken along the lines 5—5 in FIG. 4.

FIGS. 4 and 5 illustrate a connection to a printed circuit board in which an aperture through the printed circuit insulating portion 20 is lined with a metallized surface 21 formed when the printed circuit board conductive surfaces are formed on the insulating portion 20. The grooves 15 of the conductor 10*b* insure that solder contacts substantially all the wire peripheral surface and that portion of the metallized surface designated by 22. Furthermore, it has been found that if such a wire is inserted through a printed circuit board aperture, and is subjected to a solder wave, a sufficient quantity of solder flows up the grooves 15 to form a fillet on the upper surface of the printed circuit board 20 in addition to forming a fillet on the lower portion. Furthermore, as shown by FIG. 5, solder will also move up the wire 10*b* for a substantial portion of the length thereof. Such a wave soldering process is illustrated diagrammatically in FIG. 5 and designated by 24 with the printed circuit board moving in the direction of the arrow.

Figure 6:
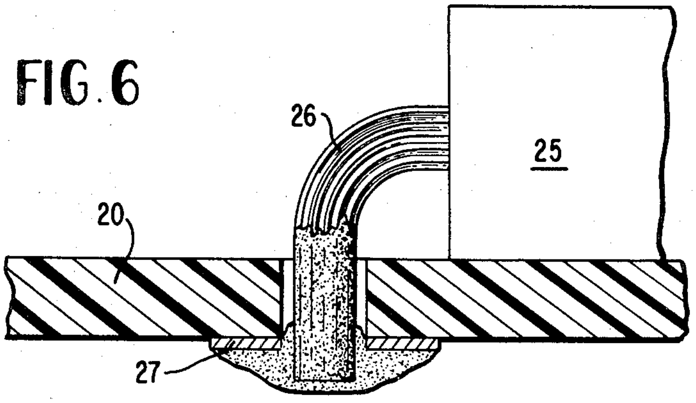
FIG. 6 illustrates another embodiment of a solder connection utilizing a wire formed in accordance with this invention.

FIG. 6 shows an alternative arrangement wherein an electrical component generally designated as 25 has an electrical lead 26 formed from a wire produced in accordance with this invention. In this particular embodiment a metallized portion 27 is formed only on the underside of the printed circuit 20. However, when subjected to the molten solder, the solder is drawn up by the grooves 15 and forms a fillet to the metallized portion 27.

It will now be evident that an improved solder connection is obtained by producing a wire in accordance with this invention. As has been shown, there is only a minimal added expense in the production of such wires as the grooves are formed in a normal production line without disruption thereof. No unnecessary elements are used so problems of the prior art caused by the introduction of a variety of elements having different coefficients of thermal expansion are overcome. As the grooves themselves constitute the capillary passages, requirements for critical dimensioning of parts is substantially eliminated making some standardization possible. Furthermore, as the ridges between the grooves tend to act as stand-offs, more complete soldering of the wire is possible.

Although this invention has been discussed with primary reference to printed circuit board connections, it will be obvious to those skilled in the art that the invention is not limited thereto. The advantages of capillary action with its improved solderability and increased wire surface area which result from longitudinal grooves are applicable to any soldering purpose to improve solder connections as illustrated in FIGS. 7 through 9.

Figures 7, 8, 9:
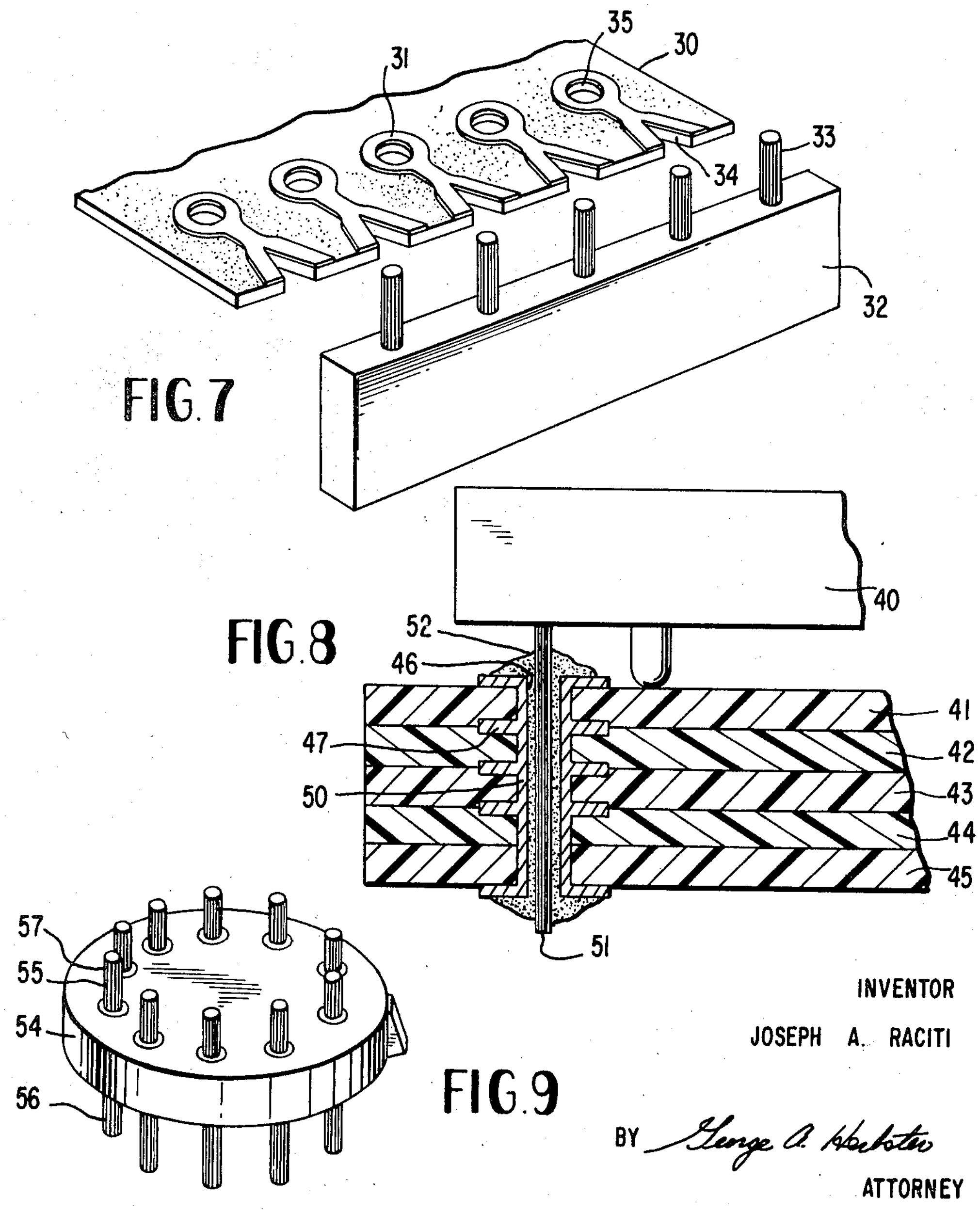
FIGS. 7 through 9 illustrate other electronic packages to which this invention is particularly adapted.

In FIG. 7 an end portion of a printed circuit board 30 having a plurality of conductor surfaces 31 formed thereon is shown. A connector block 32 is also shown including a plurality of leads 33 which are formed in accordance with this invention. These leads 33 are spaced to be in registration with a plurality of notches 34 formed in the end of the printed circuit board 30, the notches having conductive surfaces 31 formed thereat. These conductive surfaces connect to through-holes 35, for example. As the capillary action induced by conductors formed in accordance with this invention is entirely dependent upon the grooves of the conductors, it will be obvious that in this particular application solder is drawn along the grooves to form a good solder connection to the conductive surfaces 31 and other conductive surfaces which could be formed on the opposite side of the printed circuit board.

FIG. 8 shows the adaptability of this invention to use with multi-layer boards and micromodules. A micromodule 40 is shown as being connected to a plurality of printed circuit boards 41 through 45. A through-hole 46 is formed through each of the printed circuit boards 41 through 45, and this includes conductive paths 47 and a through-hole plating 50. If the solder is applied to the printed circuit board 45, then the capillary action induced by the lead 51 will cause the solder to travel up the conductor 51 and form a fillet on top of the conductive path 47 atop the printed circuit board 41, the fillet being designated by the numeral 52.

Referring to FIG. 9, there is illustrated an adapter member which has application to multi-layer boards for purposes of permitting the interconnection of a micromodule or other similar device to a plurality of otherwise standard circuits. The adapter, designated by numeral 54, has a plurality of conductors 55 formed in accordance with this invention extending therethrough. Normally, the conductors 55 would be inserted through the multi-layer circuit board in a manner similar to that shown in FIG. 8. The bottom portions, designated by numeral 56, would then be subjected to soldering; and the capillary action induced by the grooves in the conductors 55 would carry the solder up through the multi-layer circuit board to solder each of the conductors 55 thereto. In addition, through the capillary action, some of the solder would be transported up the conductors 55 so that the upper portions 57 above the adapter plate 54 would be tinned. Tinning in this manner greatly facilitates the soldering of a micromodule to the conductors 55 as it is merely necessary to wrap the wire leads from the micromodule about each of the conductors 55 and thereafter to apply heat.

What is claimed as new and desired to be secured by Letters Patent of the United States is:

1. In an electrical component adapted to be soldered the improvement of a lead wire affixed to said electrical component, said lead wire being solid in cross-section and having a plurality of integral solder capillaries about the periphery thereto, each of said solder capillaries being constituted by a groove extending parallel to the longitudinal axis of said lead wire.

2. An improved component as recited in claim 1 wherein said grooves have a depth in the range from 1 mil through 5 mils.

References Cited

UNITED STATES PATENTS

| | | | |
|---|---|---|---|
| 2,502,291 | 3/1950 | Taylor. | |
| 2,759,166 | 8/1956 | Mallina | 174—94 |
| 3,371,249 | 2/1968 | Prohofsky. | |

DARRELL L. CLAY, Primary Examiner

U.S. Cl. X.R.

29—626; 174—68.5, 126; 338—329; 339—17